United States Patent [19]

Chen

[11] Patent Number: 5,428,549
[45] Date of Patent: Jun. 27, 1995

[54] TRANSMISSION LINE FAULT LOCATION SYSTEM

[75] Inventor: Muchuan M. Chen, Springfield, Pa.

[73] Assignee: ABB Power T&D Company, Blue Bell, Pa.

[21] Appl. No.: 68,961

[22] Filed: May 28, 1993

[51] Int. Cl.⁶ ...................... G01R 31/08; G06F 15/20
[52] U.S. Cl. .................................... 364/483; 364/481; 364/482; 364/493; 364/492; 361/93; 361/80; 361/86; 361/88
[58] Field of Search ............... 364/483, 492, 723, 481, 364/482, 493; 371/1, 69; 324/76 R, 522; 361/93, 80, 85, 86, 88

[56] References Cited

U.S. PATENT DOCUMENTS

| | | | |
|---|---|---|---|
| 3,590,368 | 6/1971 | Esclangon | 324/51 |
| 4,107,778 | 8/1978 | Nii et al. | 364/492 |
| 4,128,805 | 12/1978 | Lanz | 324/52 |
| 4,281,386 | 7/1981 | Kondow et al. | 364/492 |
| 4,313,169 | 1/1982 | Takagi et al. | 364/492 |
| 4,314,199 | 2/1982 | Yamaura et al. | 324/52 |
| 4,455,612 | 6/1984 | Girgis et al. | 364/483 |
| 4,488,297 | 12/1984 | Vaid | 371/1 |
| 4,490,821 | 12/1984 | Lacher | 371/1 |
| 4,709,394 | 11/1987 | Bessler et al. | 364/723 |
| 4,795,983 | 1/1989 | Crockett et al. | 324/521 |
| 4,797,805 | 1/1989 | Nimmersjö | 364/481 |
| 4,803,635 | 2/1989 | Andow | 364/483 |
| 4,812,995 | 3/1989 | Girgis et al. | 364/481 |
| 4,871,971 | 10/1989 | Jeerings et al. | 324/509 |
| 4,906,937 | 3/1990 | Wilkström et al. | 324/522 |
| 4,979,122 | 12/1990 | Davis et al. | 364/492 |
| 4,985,843 | 1/1991 | Kotani | 364/492 |
| 5,072,403 | 12/1991 | Johns | 364/492 |
| 5,224,011 | 6/1993 | Yalla et al. | 361/93 |

OTHER PUBLICATIONS

Dissertation "Managerial Relaying: An Adaptive Approach to a System Protection Problem," by Muchuan Michael Chen, University of Pennsylvania, Mar. 1974.

Primary Examiner—Emanual T. Voeltz
Assistant Examiner—Alan Tran
Attorney, Agent, or Firm—Woodcock Washburn Kurtz Mackiewicz & Norris

[57] ABSTRACT

A fault location system comprises current and voltage transducers 10, filters 12, and a multiplexor 14, the latter outputting an interleaved stream of analog phase current and voltage signal samples, as well as neutral current samples. The analog multiplex output by the multiplexor 14 is digitized by an analog-to-digital converter 16. The output of the analog-to-digital converter 16 is fed to a digital signal processing block 18. The multiplexor necessarily introduces a time-skew between the successive samples for each channel and also introduces a time-skew between the respective channels. The system corrects the sample-to-sample time-skew for each channel, and then derives current and voltage phasors from the time-skew corrected data. Thereafter, the phasors are adjusted to correct for channel-to-channel phase-skew. In this manner, the digital signal processing block produces phasor data for each of the sampled channels. The phasor data is stored in a memory 20. The phasor data in the memory is fed to a CPU board 22, which includes a microprocessor 22-1, random access memory 22-2, and ROM 22-3. The ROM contains program code controlling the microprocessor in performing fault typing, fault location, and reporting functions.

22 Claims, 6 Drawing Sheets

NORMAL BALANCED
CONDITIONS

NOTE:
AT THE FAULT
$V_{ab} = V_{bc} = V_{ca} = 0$

THREE PHASE FAULT

NOTE:
AT THE FAULT $V_{bc} = 0$

PHASE "b"-TO-PHASE "c"
FAULT

NOTE:
AT THE FAULT
$V_{bc} = V_{bg} = V_{cg} = 0$

PHASE "b" TO-PHASE-
"c"-TO-GROUND FAULT

NOTE:
AT THE FAULT $V_{ag} = 0$

PHASE "a" TO-GROUND FAULT

TRANSMISSION LINE FAULT LOCATION SYSTEM

FIELD OF THE INVENTION

The present invention relates generally to the field of protective relaying, and relates more particularly to apparatus and methods for locating and identifying faults on an electrical transmission line section (e.g., a feeder or bulk power transfer section). The present invention also relates to techniques for synthesizing phasors from time-skewed sample data, which techniques may be employed in a transmission line fault location system.

BACKGROUND OF THE INVENTION

Protective relaying generally involves performing one or more of the following functions in connection with a protected power or energy system: (a) monitoring the system to ascertain whether it is in a normal or abnormal state; (b) metering, which involves measuring certain electrical quantities for operational control; (c) protection, which typically involves tripping a circuit breaker in response to the detection of an short-circuit condition; and (d) alarming, which provides a warning of some impending problem. Fault location is associated with the protection function. It involves measuring critical system parameters and, when a fault occurs, quickly making a rough estimate of the fault location and of certain characteristics of the fault so that the power source can be isolated from the faulted line; thereafter, the system makes a comprehensive evaluation of the nature of the fault. A fault occurs when a transmission line element, due to external causes, diverts electrical current from its normal path.

The major types and causes of faults are: insulation faults, caused by design defects, manufacturing defects, improper installation, and aging insulation; electrical faults, caused by lightning surges, switching surges, and dynamic overvoltages; mechanical faults, caused by wind, snow, ice, and contamination; and thermal faults, caused by overcurrent and overvoltage conditions.

A fault may cause current in one or more of the phase lines (referred to herein as the "a", "b", and "c" phases) to be diverted to ground, to a neutral line (denoted "n"), or to another phase line. The phasor diagrams in FIGS. 1A–1E illustrate the effect of faults on the system voltages and currents. The diagrams are for effectively grounded systems wherein the neutral is solidly grounded; however, they are illustrative of the effects of faults on other types of systems, e.g., ungrounded and impedance grounded systems. In the diagrams, the dotted, uncollapsed voltage triangle exists in the source (the generator) and the maximum collapse is at the fault location. The voltages between the source and fault will vary between these extremes. The diagrams depict the effects of various types of faults on the currents and voltages (represented by phasors) in the system. FIG. 1A depicts the phasors for normal, balanced conditions; FIG. 1B depicts the phasors for a three-phase fault ($V_{ab}=V_{bc}=V_{ca}=0$ at the fault); FIG. 1C depicts the phasors for a phase b-to-phase c fault ($V_{bc}=0$ at the fault); FIG. 1D depicts the phasors for a phase b-to-phase c-to-ground fault ($V_{bc}=V_{bg}=V_{cg}=0$ at the fault); and FIG. 1E depicts the phasors for a phase a-to-ground fault ($V_{ag}=0$ at the fault).

The present invention relates to fault location and fault typing in connection with electrical conductors of a power transmission system. The term "transmission line" as employed herein is intended to cover any type of electrical conductor, including high power conductors, feeders, and transformer windings.

One of the functions of a protective relaying system is to identify the type of fault. Fault type identification, or fault typing, includes determining whether the fault is between phases or between one or more phases and ground, and determining the specific phase or phases involved in the fault. The prior art employs comparisons of different combinations of currents and voltages to determine fault type through predominantly analog techniques. For example, U.S. Pat. No. 4,795,983, Jan. 3, 1989, titled "Method and Apparatus for Identifying a Faulted Phase," (originally assigned to Westinghouse Electric Corp.; reassigned on Jun. 7, 1990 to ABB Power T&D Company, Inc.) discloses a technique for identifying faults in a three-phase power transmission line. The disclosed technique involves subtracting a prefault current phasor and a zero-sequence current phasor for each phase from a post-fault current phasor for that phase, and comparing the magnitudes of the resultant phasors.

Another function of protective relaying systems is to estimate the location and resistance of the fault. For example, as described in U.S. Pat. No. 4,906,937, Mar. 6, 1990, titled "Method and a Device for Fault Location in the Event of a Fault on a Power Transmission Line" (assigned to Asea Brown Boveri AB, Vasteras, Sweden), in connection with distance protection devices for protecting cables and overhead or underground power transmission lines, it is normally desirable to estimate the distance from a measuring station to a possible fault and to determine the magnitude of the fault resistance.

The basic principles of fault location and determination of fault resistance are well known. Typically, measured values are obtained with the aid of measuring transformers in a measuring station located adjacent to a protected line. Present-day techniques employ analog-to-digital (A/D) conversion and filtering of the measured values. The filtered digital values are then processed by various equations to determine the fault distance and the magnitude of the fault resistance.

There are several known distance protection equations. Two of the most ordinary ones will be briefly described with reference to FIG. 2A, which depicts a line between stations P and Q on which a fault to ground has arisen at point F. Both of these equations assume knowledge of the faultless line impedance $Z_{PQ}$ on the protected line segment between two measuring stations P and Q. After the detection of a fault, the voltages $U_P$ and $U_Q$ and the currents $I_P$ and $I_Q$ are measured in the respective stations. To eliminate the need for communication between the stations, the values measured at one of the stations are employed as a starting-point. If the assumption is made that a current $I_F$ flows through a fault resistance $R_F$, producing a voltage $U_F$ across the fault resistance, the following relationship can be assumed:

$$U_P = U_{PF} + U_F = \alpha U_{PQ} + U_F = \alpha Z_{PQ} I_P + R_F I_F \qquad (0.1)$$

where $\alpha$ is a parameter having a value in the range 0 to 1 and is an assumed measure of the fault position, and $U_{PQ}$ is an estimate of the voltage drop across the whole line. The $U_{PQ}$ estimate is determined with the aid of $I_P$, which is measured.

Equation (0.1) is not directly solvable because it contains too many unknown parameters (i.e., $U_{PF}$, $U_F$, $\alpha$, $R_F$, $I_F$ are unknown quantities). Therefore, certain assumptions must be made. It is common to assume that the fault current $I_F$ is proportional to the current measured in station P. That is, it is assumed that $$I_F = k_1 I_P \quad (0.2)$$

This assumption is fulfilled if the voltages $U_P$ and $U_Q$ at P and Q have equal phases and if the phase angles for the impedances from the fault location F to the respective stations P, Q are equal. Equation (0.1) can then be written:

$$U_P = \alpha Z_{PQ} I_P + R_F k_1 I_P = \alpha Z_{PQ} I_P + R_{F1} I_P \quad (0.3)$$

where $R_{F1}$ is an apparent fault resistance.

Another variant of the necessary assumption is to assume that the fault current is proportional to the current change at P when a fault has occurred. That is, it is assumed that $$I_F = k_2 \Delta I_P \quad (0.4)$$

Therefore, equation (0.1) can be expressed, $$U_P = \alpha Z_{PQ} I_P + R_F k_2 \Delta I_P = \alpha Z_{PQ} I_P + R_{F2} \Delta I_P \quad (0.5)$$

Equations (0.3) and (0.5) each comprise two unknown parameters, $\alpha$ and $R_{F1}$ or $R_{F2}$, respectively. This means that a linear regression (or some other appropriate problem solving technique) is required to solve for the unknown parameters.

When distance protection devices with fault location and determination of fault resistance are used in connection with high voltage transmission lines, capacitive voltage transformers (CVTs) are usually used for the voltage measurement. It is well known that such voltage measurement devices cause measurement error voltages, called "CVT transients."

The above cited U.S. Pat. No. 4,906,937 describes a fault location system that specifically addresses the problem of CVT transients. The disclosed system is depicted schematically in FIG. 2B. As described in the patent, phase voltages $U_P$ and phase currents $I_P$ are measured on a high voltage network RST at a measuring station P. The patent discloses that either of the following two distance protection equations may be employed as a starting-point:

$$U_{PM1} = \alpha Z_{PQ} I_P + R_{F1} I_P + \Delta U_{CVT} \quad (0.6)$$

$$U_{PM2} = \alpha Z_{PQ} I_P + R_{F2} \Delta I_P + \Delta U_{CVT} \quad (0.7)$$

If equation (0.6) is made the starting-point, the device for fault location is continuously switched and controls the state of the line. If equation (0.7) is made the starting-point, a least prescribed change of $I_P$ must be assumed to initiate the control of the state of the line. The measuring voltage $U_{PM}$ is obtained via a capacitive voltage divider 1 and a conventional transformer 2. The current $I_P$ is measured with a current transformer 3. The measured values are low-pass filtered in filters 4 and 5. The filtered voltage and current signals are converted to digital data by analog-to-digital conversion devices (A/Ds) 6, 7. The instantaneous digitalized current and voltage values are supplied to a calculator 8, which processes the data to obtain estimated values of: $\alpha$, representing the fault position; $R_{F1}$ and $R_{F2}$, respectively representing the apparent fault resistance; and $\Delta U_{CVT}$, representing the fault voltage. The values of $\alpha$, $R_{F1}$, and $R_{F2}$ are supplied to a logic unit 9 for comparison with upper and lower limit values $\alpha_{min}$, $\alpha_{max}$, $RF_{min}$, and $RF_{max}$, respectively. If the $\alpha$ and RF values lie within the stated limits, a decision B to trip is given.

As indicated by the above discussion of the prior art, some prior art fault location systems make the mathematically convenient assumption that the source and load voltages have equal phases when a fault occurs. However, this assumption is only true if there is no power flow through the line just prior to the occurrence of the fault, which is not typically the case. One goal of the present invention is to provide a fault location system that does not require such an assumption. In addition, some prior art systems do not perform well when there is a large pre-fault power flow; some prior art systems assume that the line and source impedances are the same, which is not always true; and some prior art systems require the protected power system to be modified in some way, e.g., by requiring current and voltage pulses to be placed on the protected lines, as opposed to being passive, i.e., not requiring the protected system to be modified. The present invention is intended to overcome these limitations of the prior art.

SUMMARY OF THE INVENTION

The present invention provides a fault location system for locating faults associated with one or more conductors of a power distribution system, the system having an associated protective relay at a known location along the conductors. According to the invention, such a system comprises a multiplexor for obtaining multiple samples of a plurality of phase currents and voltages, the multiplexor introducing a time-skew into at least some of the samples; an analog-to-digital convertor for converting the samples to digital sample data; means for deriving time-skew corrected sample data from the digital sample data; means for deriving phasor data for the currents and voltages on the basis of the time-skew corrected data; (e) means for detecting when a fault occurs; (f) means for processing the phasor data to compose a pre-fault fundamental phasor and a post-fault fundamental phasor, wherein the pre-fault and post-fault phasors are phase coherent; and (g) means for iteratively determining a fault location parameter (M) and a fault resistance parameter (RF) on the basis of the phase coherent pre-fault and post-fault fundamental phasors.

In one preferred embodiment of the present invention, the means for deriving time-skew corrected sample data from the digital sample data comprises means for estimating the value of a desired sample ($V_{i+1}(t)$) from the equation:

$$V_{i+1}(t) = (sk/dts)V_i(t+sk) + (V_{i+1}(t+sk))(dts-sk)/dts,$$

where "sk" represents the time skew between the desired sample $V_{i+1}(t)$ and a time-skewed sample $V_{+1}(t+sk)$, and "dts" represents a known sampling interval between the time skewed sample $V_{i+1}(t+sk)$ and a previous time-skewed sample $V_i(t+sk)$. In addition, since the multiplexor introduces a phase-skew between signal channels, the fault location system further comprises phase-skew correction means for correcting for the phase-skew between respective phasors obtained from different channels. For example, the phase-skew correction means may multiply the phasors to be corrected by a phasor of the form, $e^{j\phi sk}$, where $\phi sk$ represents the phase-skew.

The means for deriving phasor data may comprise means for performing a Fourier transformation of the time-skew corrected data or may comprise means for deriving a real part of a given phasor by performing a convolution of corresponding time-domain samples with a unit cosine function and deriving an imaginary part of the given phasor by performing a convolution of the time-domain samples with a unit sine function, wherein the given phasor is composed of the real and imaginary parts.

The power distribution system, in preferred applications of the invention, comprises multiple phases (phase-a, phase-b, phase-c). The preferred embodiment of the fault location system comprises means for determining, on the basis of the phasor data, whether the fault is a phase-to-phase, three-phase, phase-to-ground, phase-to-phase-to-ground, or three-phase-to-ground fault. Preferably, the phase current and voltage samples are obtained at a protective relay location and the preferred fault location system comprises loop compensation means for adjusting a relay current sample $I_{rly}$ to compensate for current loops. For ground fault cases, the loop compensation means derives an adjusted relay current sample ($I_{rly}'$) from a relay current sample ($I_{rly}$) in accordance with the formula, $$I_{rly}' = I_{rly} + \kappa I_0 (ZL_{zero} - ZL_{pos})/Z_{pos},$$

where $$I_0 = (I_a + I_b + I_c)/3,$$

$I_a$, $I_b$, and $I_c$ respectively represent phase-a, phase-b, and phase-c current phasors; $\kappa$ is a scaling parameter in the range 0.7–1.5; and $ZL_{pos}$ and $ZL_{zero}$ respectively represent a positive sequence impedance and a zero sequence impedance. For phase-to-phase and phase-to-phase-to-ground faults, an adjusted relay voltage ($V_{rly}'$) and an adjusted relay current ($I_{rly}'$) are derived from phase voltage samples ($V_x$, $V_y$) and phase current samples ($I_x$, $I_y$) as $$V_{rly}' = V_x - V_y, \text{ and}$$

$$I_{rly}' = I_x - I_y$$

where the subscripts x, y represent the particular phases involved in the fault. For three-phase and three-phase-to-ground faults an adjusted relay voltage sample ($V_{rly}'$) and an adjusted relay current sample ($I_{rly}'$) are derived from a phase voltage sample ($V_a$, $V_b$, $V_c$) and a phase current sample ($I_a$, $I_b$, $I_c$) as $$V_{rly}' = V_a \text{ or } V_b \text{ or } V_c \text{ and}$$

$$I_{rly}' = I_a \text{ or } I_b \text{ or } I_c.$$

The relay voltage ($V_{rly}$) and relay current ($I_{rly}$) may be composed from a phase voltage phasor ($V_a$, $V_b$, $V_c$) and a phase current phasor ($I_a$, $I_b$, $I_c$) in accordance with the following table, wherein $ZL_{pos}$ and $ZL_{zero}$ respectively represent a positive sequence impedance and a zero sequence impedance:

| Fault Type | $I_{rly}$ | $V_{rly}$ |
| --- | --- | --- |
| a-G | $I_a$* | $V_a$ |
| b-G | $I_b$* | $V_b$ |
| c-G | $I_c$* | $V_c$ |
| b-c-G | $I_b - I_c$ | $V_b - V_c$ |
| c-a-G | $I_c - I_a$ | $V_c - V_a$ |
| a-b-G | $I_a - I_b$ | $V_a - V_b$ |
| b-c | $I_b - I_c$ | $V_b - V_c$ |
| c-a | $I_c - I_a$ | $V_c - V_a$ |
| a-b-c | $I_a$ | $V_a$ |

*for Phase-Ground Faults, $I_{rly} = I_{rly} + k((ZL_{zero} - ZL_{pos})/ZL_{pos})I_{zero}$ In preferred embodiments of the present invention, a multiplexor and A/D are employed to obtain voltage and current samples for each phase of a multi-phase power distribution system. The multiplexor necessarily introduces a time-skew between the successive samples for each channel and also introduces a time-skew between the respective channels. The preferred embodiment described herein corrects the sample-to-sample time-skew for each channel. It then derives current and voltage phasors from the time-skew corrected data. Thereafter, the phasors are adjusted (rotated) to correct for the channel-to-channel phase-skew (which is a consequence of the time-skew between channels). The fault type is then determined. The fault type information is employed to derive pre-fault and post-fault voltage and current phasors (referred to herein as $V_{rly}$, $I_{rly}$) which are employed to iteratively derive fault location parameters (M, M1, M1 . . . ) and fault resistance parameters (RF, RF1, RF11 . . . ) as described in detail below.

Important features of preferred embodiments of the present invention include:

1. The present invention provides a technique for synthesizing correlated phasors from currents and voltages measured at different times. As described in greater detail below, this feature provides a way of cost-effectively implementing a fault location system, e.g., by employing a single multiplexor and A/D to sample multiple voltages and currents, as opposed to employing multiple sample-and-hold circuits or multiple A/Ds. This feature of the invention may also be employed in metering and other types of systems where multiple data channels are sampled.

2. The synchronizing mechanism may be employed to adaptively shift the sampling frequency in accordance with the sampled signal's fundamental frequency. For example, the same hardware as employed in connection with a 60 Hz system could be employed with a 50 Hz system by making slight changes to the programming of a microprocessor.

3. Apparent source and load impedances are determined dynamically without prior information.

4. The transient nature of the fault resistance can be tracked.

5. Faults on non-homogeneous lines may be located by modifying the equations described below to account for line segments with different line angle characteristics, defined as the ratio of reactance per unit length to resistance per unit length (X/R).

Other features and advantages of the present invention are described below.

DETAILED DESCRIPTION OF PREFERRED EMBODIMENTS

Figure 1A:
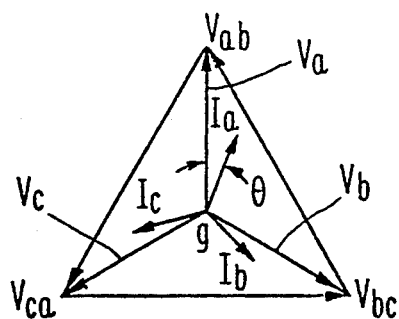
FIGS. 1A–1E are phasor diagrams depicting the effects of various types of solid faults on the currents and voltages of a typical power system.
Figure 1B:
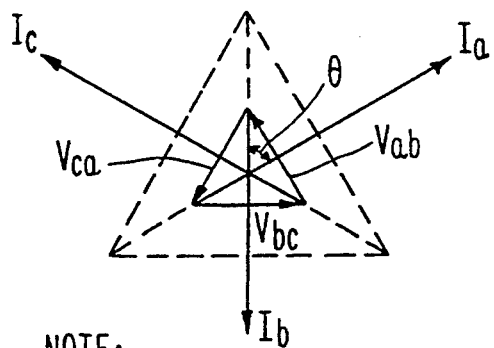
Figure 1C:
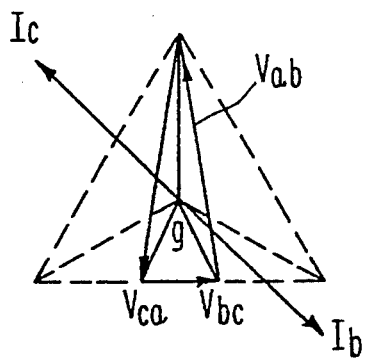
Figure 1D:
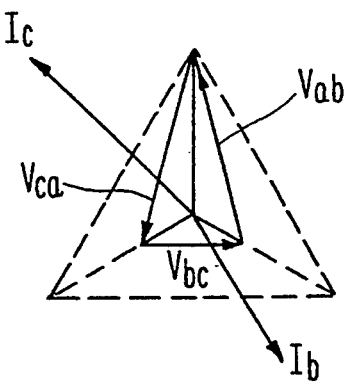
Figure 1E:
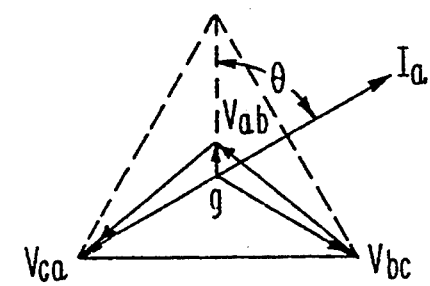
Figure 2A:
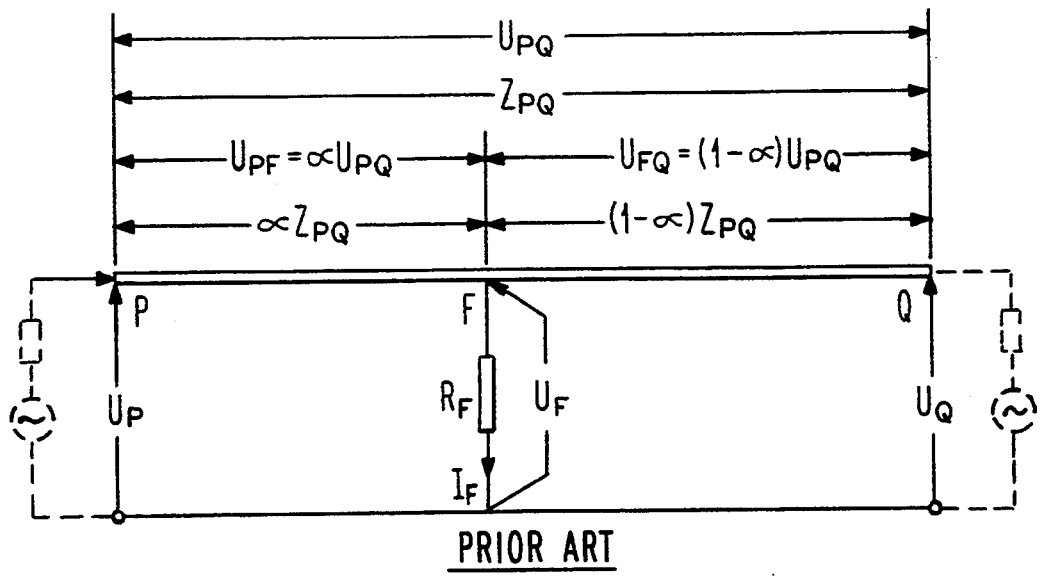
FIG. 2A is a schematic diagram of a faulted transmission line section.
Figure 2B:
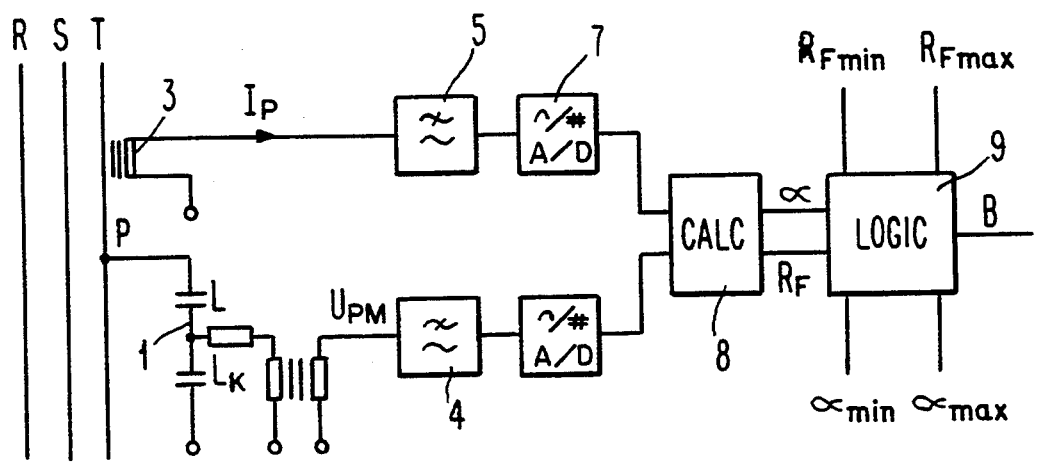
FIG. 2B is a schematic diagram of one prior art fault location system.
Figure 3:
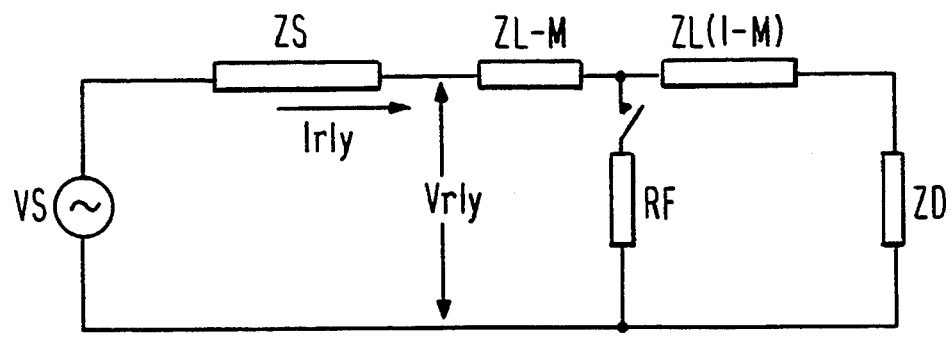
FIG. 3 is a model referred to below in explaining the present invention.

FIG. 3 depicts a model useful for explaining the present invention. The elements of the model represent physical quantities as follows:

$VS_{mes}$: Equivalent aggregate source bus voltage
$V_{rly}$: Potential measured at relay
$I_{rly}$: Current measured at relay
ZS: Equivalent source impedance
ZD: Equivalent far-end load impedance
RF: Equivalent fault resistance
M: Relay-to-fault reach (distance) on a scale of 0–1 (M is similar to $\alpha$, referred to above in discussing the prior art).

Typically, M, RF, ZD, and ZS will be unknown and $V_{rly}$ and $I_{rly}$ will be measured. M will be zero when a fault occurs at the relay location and one when a fault occurs at the far-end load location; M will be greater than one when a fault occurs beyond the far-end load and less than zero when a fault occurs behind the measuring point.

The mathematical theory behind the present invention will now be described with reference to FIG. 3.

Initial Fault Location and Preprocessing

Using pre- and post-fault measured voltages and currents, the aggregate source bus potential VS can be related to the source impedance ZS as follows:

$$V_{rly0} = VS - I_{rly0}ZS \quad (1)$$

$$V_{rly1} = VS - I_{rly1}ZS \quad (2)$$

where the subscripts 0, 1 refer to pre-fault and post-fault, respectively. A formula for deriving an estimate of the source impedance can be obtained by subtracting equation (2) from equation (1):

$$ZS_{mes} = (V_{rly} - V_{rly1})/(I_{rly1} - I_{rly0}) \quad (3)$$

Similarly, a formula for deriving an estimate of the source bus potential can be obtained by rearranging equation (1):

$$VS_{mes} = V_{rly0} + I_{rly0}ZS_{mes} \quad (4)$$

Further, the far-end load impedance ZD can be estimated from:

$$ZD_{mes} = V_{mes}/I_{rly0} - ZL - ZS_{mes} \quad (5)$$

or $$ZD_{mes} = V_{rly0}/I_{rly0} - ZL \quad (5.1)$$

In state 1, after the occurrence of a fault, the apparent fault impedance as viewed at the relay is given by $$ZF_{ap1} = V_{rly}/I_{rly1} \quad (6)$$

However, due to the effect of the intervening line segment ZLxM, the apparent fault impedance at the relay is an untrue measure of the true fault impedance.

Adaptive Fault Location

Another, more explicit formula for the post-fault apparent fault impedance $ZF_{ap1}$ is $$ZF_{ap1} = M\,ZL + (RF((1-M)ZL + ZD))\,/\,((1-M)ZL + ZD + RF) \quad (7)$$

Using equations (1) through (6) to obtain an estimate of the source impedance $ZS_{mes}$, load impedance $ZD_{mes}$, and apparent fault impedance seen by the relay $ZF_{ap1}$, a first iterative distance parameter M1 is estimated as $$M1 = Im(ZF_{ap1})/Mag(ZL) \quad (8)$$

where "Mag" is an absolute value or magnitude function.

The fault resistance is then estimated as $$RF1 = (((1-M1)ZL + ZD1)(ZF_{ap1} - M1\,ZL))/(-ZF_{ap1} + ZL + ZD1) \quad (8.1)$$

The first iteration solutions for M1 and RF1 are thus acquired. The present inventor has experimentally determined that the smaller of the M1 solutions (obtained, e.g., by equation (8)) applies to power flow toward ZD. Accordingly, the proper solution set M1, RF1 may be calculated by iteratively repeating the process of equations (8) and (8.1) and comparing the respective solutions to the pre-fault power transfer angle as determined by the angle of the load current and voltage, which are estimated by the system. The iterative process terminates when the location parameter M converges.

Correction Factors

Correction factors for fault resistance, load impedance and line impedance (referred to herein as "RFFAC", "ZDFAC", and "ZLFAC", respectively) may be derived, e.g., from pattern tracing or curve fitting. A second iterative distance estimate M11 is given by:

$$M11 = M1 - (0.06Re((ZF_{ap1}/ZLFAC)(ZDFAC/RFFAC))) \quad (9)$$

The fault resistance correction factor RFFAC is estimated as:

$$RFFAC = RFTRIM1\,(50/Mag(RF1))^{0.8} \quad (10)$$

where RF1 is obtained from equation (8.1) and RFTRIM is derived as follows:
RFMUL = Mag(RF1)
RFTRIM1 = 7.6 if RFMUL > 51
RFTRIM1 = 8.4 if RFMUL < 51.1

RFTRIM1=6.8 if RFMUL >91

The above process for setting RFTRIM1 could be implemented with a sequential software program (which is essentially what the above formula is) or could be implemented with a lookup table.

The load impedance correction factor ZDFAC is given by:

$$ZDFAC=(583/Mag(ZD))^{0.8} \quad (11)$$

The line impedance correction factor ZLFAC is given by:

$$ZLFAC=Mag(ZL)/9.124 \quad (12)$$

After, the correction factors are derived and M11 is computed, RF11 would be computed in accordance with equation (8.1). The present inventor has determined that, with two iterations, +3% to 0% of the full line may be consistently achieved with up to 140 ohm fault impedance and a wide range of source, load, and line impedances.

Test Results

The following table summarizes test results in estimating M after one and two iterations, with the fault moved in increments of 0.1 times the line length from the relay to the load. Thus, for k =1, the correct value of M is 0.1; for k=2, the correct value of M is 0.2, and so on. The table indicates that the error decreases as the fault approaches the far-end load. Thus, the correction factors may be optimized to achieve the best accuracy at a prescribed value of M.

| k | M1$_k$ | M11$_k$ |
|---|---|---|
| 1 | 0.537 | 0.122 |
| 2 | 0.636 | 0.22 |
| 3 | 0.736 | 0.317 |
| 4 | 0.835 | 0.415 |
| 5 | 0.934 | 0.513 |
| 6 | 1.034 | 0.611 |
| 7 | 1.133 | 0.709 |
| 8 | 1.232 | 0.806 |
| 9 | 1.332 | 0.904 |
| 10 | 1.431 | 1.002 |

Compensation of Loop Parameters

To increase the accuracy of the above process, the measured current and voltage may be modified to account for current loops not represented in the model used above.

For ground fault cases, the current measured at the relay may be set as follows:

$$I_{rly}'=I_{rly}+\kappa I_0(ZL_{zero}-ZL_{pos})/ZL_{pos} \quad (13)$$

where $$I_0=(I_a+I_b+I_c)/3 \quad (14)$$

and $\kappa$ is a scaling parameter in the range 0.5–1.5. The subscripts "pos" and "zero" refer to positive sequence and zero sequence, respectively.

For phase-to-phase and phase-to-phase-to-ground faults, the relay voltage and current are set as $$V_{rly}'=V_x-V_y \quad (15)$$

$$I_{rly}'=(I_x-I_y) \quad (16)$$

where the subscripts x, y represent the particular phases involved in the fault. For example, for a phase-a to phase-b fault, "X" would be "a" and "y" would be "b".

For three-phase and three-phase-to-ground faults, the relay voltage and currents could advantageously be set as $$V_{rly}'=V_a \quad (17)$$

$$I_{rly}'=I_a \quad (18)$$

where the selection of $V_a$ and $I_a$ is arbitrary, i.e., $V_{rly}$, $I_{rly}$ could be respectively set to $V_b$, $I_b$ or $V_c$, $I_c$ as well.

Extension to Non-homogeneous Feeder Segments

For cases where the line characteristics (X/R) vary with distance from the relaying point, e.g., where the protected line is composed of a series of line segments with different line characteristics (X/R), a series of iterative seeking procedures may be employed. However, the locations of the starting and ending points of each segment must be known, at least approximately. The above procedure can be modified by determining the faulted segment based on M1 and then employing as ZL the effective line impedance up to the faulted segment.

Phase Space Synchronization and Phasor Composition

The fault location search scheme dynamically measures the apparent source and load impedances without prior information. Relevant sets of correlated system phasors are obtained with a synchronizing procedure for all pre-fault and "post-fault" signals. (Post-fault is in quotes because the so-called post-fault signals actually correspond to samples taken as the fault is happening.) A seed estimate of apparent fault location is thereby acquired.

According to the present invention, the fault-descriptive signals (i.e., phase voltage and current samples) are manipulated in phasor space. A correlation is effected by defining the pre-fault state as a time reference. The elapsing time is equally segmented into intervals of one-quarter period of the fundamental system frequency. Each time interval encompasses a set of a fixed number of digitized signals.

Figure 3A:
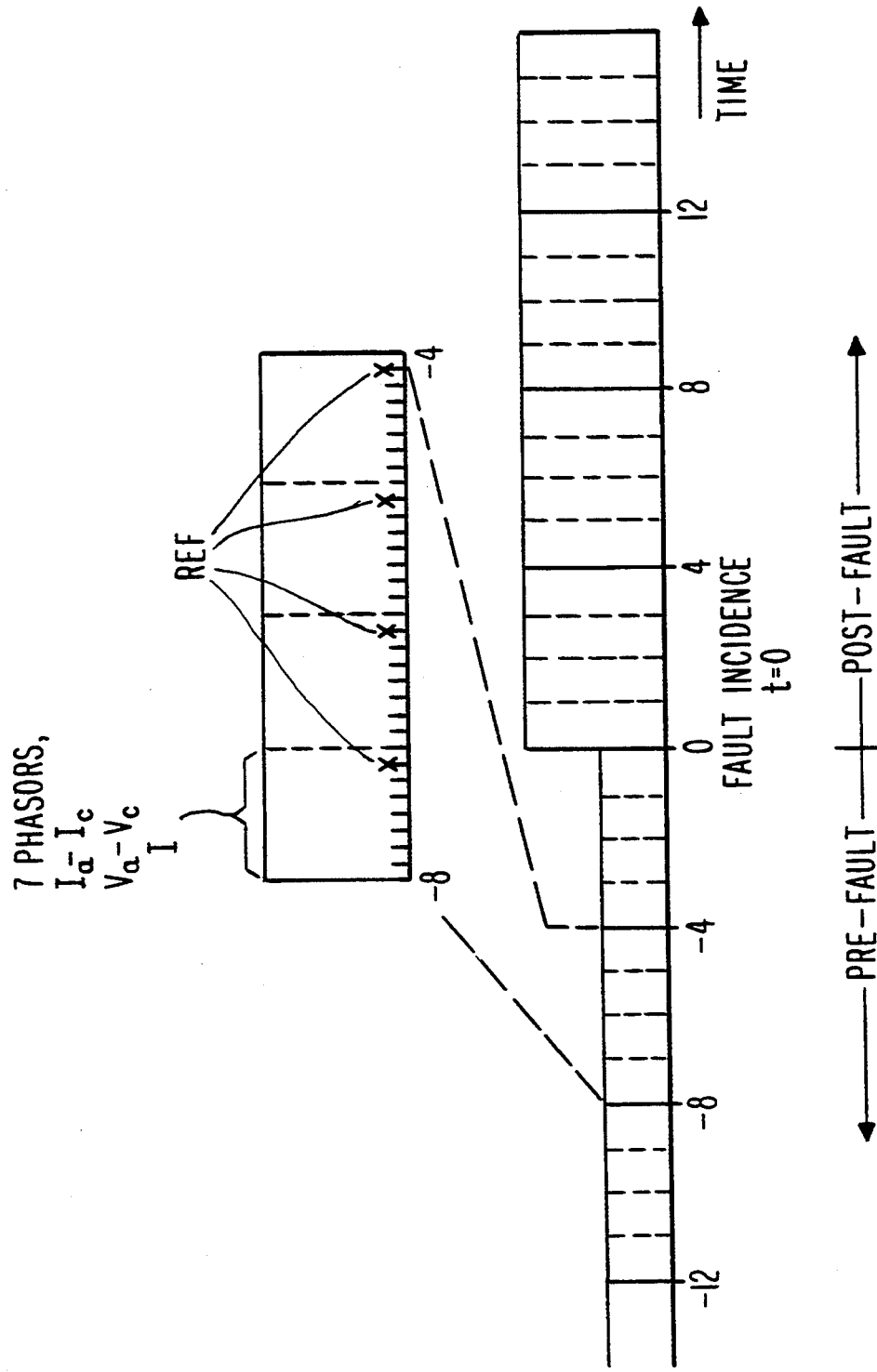
FIG. 3A illustrates the segmentation of pre-fault and post-fault time intervals in accordance with the present invention.

FIG. 3A illustrates how the pre- and post-fault data may be segmented such that each period of the fundamental frequency (each block in the Figure) contains four clock ticks. For example, if thirty-two samples per fundamental period are used to compose a phasor for each signal channel, at each clock tick, a set of thirty-two samples for the individual signals are assembled looking back in time. These sets of assembled signals are then used to derive equivalent phasors (e.g., a phase-a current phasor $I_a$) at that clock tick. (As described further below, each block in FIG. 3A would preferably include samples of seven signals, $I_a$, $I_b$, $I_c$, $V_a$, $V_b$, $V_c$, $I_n$, where $I_n$ represents neutral current.) Equations (19)–(21) illustrate how the phase-a current phasor may be derived. Similar equations may be employed to derive current and voltage phasors for $I_b$, $I_c$, $V_a$, $V_b$, $V_c$, and $I_n$.

$$Re(\overline{Ia}(t)) = k_c \sum_{i=0}^{31} h\left(\cos\left(2\pi \frac{(31-i)}{32}\right)\right) Ia_i(t) \quad (19)$$

$$Im(\overline{Ia}(t)) = k_s \sum_{i=0}^{31} h\left(\sin\left(2\pi \frac{(31-i)}{32}\right)\right) Ia_i(t) \quad (20)$$

$$\bar{I}_a(t) = Re(\bar{I}_a(t)) + J^*Im(\bar{I}_a(t)) \qquad (21)$$

Equations (19) and (20) represent a convolution of the phase current with unit cosine and sine functions. The parameters $k_c$ and $k_s$ are scaling factors; "J" represents the "imaginary" number, square root of negative one $((-1)^{\frac{1}{2}})$.

In the scheme illustrated by FIG. 3A, smaller blocks represent pre-fault signals and larger blocks represent post-fault signals. Each block includes four phasor sets, each set including seven phasors $I_a$, $I_b$, $I_c$, $V_a$, $V_b$, $V_c$, $I_n$. Post- and pre-fault phasors are paired by selecting a reference (REF) in the pre-fault period. For example, a set of phasors could be used to derive a reference phasor, which could be, e.g., the central phasor in the set. For example, the $I_s$ phasor derived at time tick #8 (post-fault) may be related to the pre-fault phasor derived at time tick #−4, and the $I_a$ phasor derived at time tick #9 may be related to the $I_a$ phasor derived at time tick #−7.

Synthesizing Coherent Phasors From Time-Skewed Data

As described in more detail below, one presently preferred embodiment of the present invention multiplexes a plurality of current and voltage signals ($I_a$, $I_b$, $I_c$, $V_a$, $V_b$, $V_c$, $I_n$) into a single analog-to-digital conversion device (A/D). The digital samples are weighted and combined to synthesize phasors for use in a fault location/identification procedure. The act of multiplexing the signals into a single A/D, as opposed to feeding each signal into its own A/D, results in a time skew between successive samples. That is, all signals would ideally be sampled at the same time t, which could be achieved by using a sample-and-hold device or A/D for each channel. However, the use of a sample-and-hold device or A/D for each channel would significantly increase the cost of the system and would lower the system's inherent noise immunity. The multiplexing scheme overcomes the problems presented by the sample-and-hold scheme but results in the first channel being sampled at time t and the next channel being sampled at time t+sk (where "sk" represents the time skew introduced by the multiplexor), and the next channel being sampled at t+2sk, and so on. According to the present invention, the weights of individual signal channels are adjusted, as described below, to correct for the time skew introduced by the multiplexor.

Figure 4:
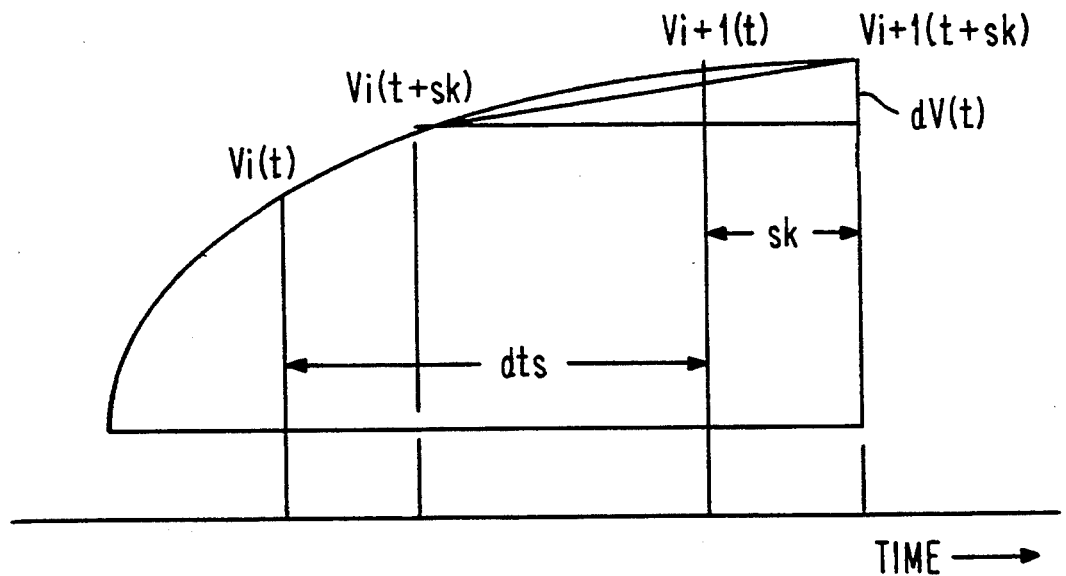
FIG. 4 is a voltage over time plot referred to below in explaining an inventive technique for synthesizing phasors from time-skewed sample data.

Referring now to FIG. 4, the sample weighting will be described with reference to an exemplary voltage waveform V, where "V(t)" represents the magnitude of V at time t.

Let $V_i(t)$ and $V_{i+1}(t)$ represent consecutive ideal samples of V, i.e., these are the samples that would be obtained if the signal V(t) were sampled at the ideal, desired sample times t. Let $V_i(t+sk)$ represent the i-th sample taken at t+sk, the ideal time t plus a forward time skew sk; let $V_{i+1}(t+sk)$ represent the i+1-th sample taken at time t plus a forward time skew sk; and let "dts" represents a fixed sampling interval of a given signal channel. From FIG. 6, it can be seen that $$dV_i(t)/dV_{i+1}(t) = (dts-sk)/dts \qquad (22)$$

and that $V_{i+1}(t)$, the ideal sample, may be derived from the skewed samples $V_i(t+sk)$ and $V_{i+1}(t+sk)$ from the equation:

$$V_{i+1}(t) = (sk/dts)V_i(t+sk) + (V_{i+1}(t+sk))(dts-sk)/dts \qquad (23)$$

Therefore, let $$A_n = n^*sk/dts; \; B_n = (dts - n^*dts)/dts \qquad (24)$$

It follows that $$V_{i+1}(t)(n=1) = A_1 V_i(t+sk) + B_1 V_{i+1}(t+sk) \qquad (25)$$

where "n" represents the number of time skews the desired sample is away from the actual (i.e., known) sample. It is best to select the reference sample such that it will be in the center of a cluster, such that the error will be small.

Similarly, $$V_{i+1}(t)(n=2) = A_2 V_i(t+sk) + B_2 V_{i+1}(t+sk) \qquad (26)$$

Experimental results indicate that the synthesized signal's error ranges are as follows:

| Skew | Worst Case Error | Actual Error (Worst) | Actual Error (Typical) |
|---|---|---|---|
| 1–15 μs | 0.002% | | |
| 3–15 μs | 0.014% | | |
| 6–15 μs | 0.057% | <1 degree | <0.5° |
| 1–45 μs | 0.014% or 0.9° | | |
| 3–45 μs | 0.13% or 3° | | |

After time-skew corrected data is obtained for all channels, the phase-skew between individual channels may, and should, be corrected, e.g., by multiplying the phasor representations of the signals by a phasor of the form, $e^{j\phi sk}$, where $\phi sk$ represents the phase offset or skew due to the time skew between channels.

Fault Typing Procedure

All faults are identified as either a phase fault or a ground fault. In preferred embodiments of the present invention, two parameters, $\epsilon_{zero}$ and $\lambda_{zero}$, are derived for fault classification:

$$\epsilon_{zero} = (1/64)Max(abs(I_a), abs(I_b), abs(I_c)) \qquad (27)$$

$$\lambda_{zero} = abs(I_a + I_b + I_c)/3 \qquad (28)$$

According to the invention, the fault is classified as a phase fault if $\epsilon_{zero} - \lambda_{zero}$ is positive; otherwise, the fault is classified as a ground fault.

Once the fault has been classified, the specific fault type is determined by comparing all phase currents with an overcurrent pickup or some other predetermined disturbance detection pickup, the latter being independent of the overcurrent pickup. The fault typing software module is employed when the measured parameter exceeds a prescribed threshold (e.g., when a measured correct exceeds an overcurrent pickup). See the below discussion in connection with FIG. 6. Fault typing is performed in accordance with the following tables, wherein the notation "f()" refers to a parameter which is set to zero ("false") when the argument is less than a corresponding threshold (e.g., when $I_a$ < an overcurrent pickup) and 1 ("true") when the argument is greater than or equal to the threshold.

| f($I_a$) | f($I_b$) | f($I_c$) | Fault Type |
|---|---|---|---|
| Ground Faults | | | |
| 1 | 0 | 0 | a-G Fault |
| 0 | 1 | 0 | b-G Fault |
| 0 | 0 | 1 | c-G Fault |
| 1 | 1 | 0 | a-b-G Fault |
| 0 | 1 | 1 | b-c-G Fault |
| 1 | 0 | 1 | c-a-G Fault |
| 1 | 1 | 1 | 3φ Fault |
| For Phase Faults | | | |
| 1 | 1 | 0 | a-b Fault |
| 0 | 1 | 1 | b-c Fault |
| 1 | 0 | 1 | a-c Fault |
| 1 | 1 | 1 | 3φ Fault* |

*Note: If the logical combination fails to meet all four possible combinations presented in the table, the fault typing process jumps to the "For Ground Faults" process.

Relay Signal Composition

In presently preferred embodiments of the invention, the quantities discussed above in the fault signal arrays are combined as tabulated below to compose a relay current and voltage ($I_{rly}$, $V_{rly}$), which are employed as described above in connection with equations (1) through (9) to derive the fault location parameters (M, M1, M11, ...) and fault resistance parameters (RF, RF1, RF11, ...).

| Fault Type | $I_{rly}$ | $V_{rly}$ |
|---|---|---|
| a-G | $I_a$* | $V_a$ |
| b-G | $I_b$* | $V_b$ |
| c-G | $I_c$* | $V_c$ |
| b-c-G | $I_b$-$I_c$ | $V_b$-$V_c$ |
| c-a-G | $I_c$-$I_a$ | $V_c$-$V_a$ |
| a-b-G | $I_a$-$I_b$ | $V_a$-$V_b$ |
| b-c | $I_b$-$I_c$ | $V_b$-$V_c$ |
| c-a | $I_c$-$I_a$ | $V_c$-$V_a$ |
| a-b-c | $I_a$ | $V_a$ |

Figure 5:
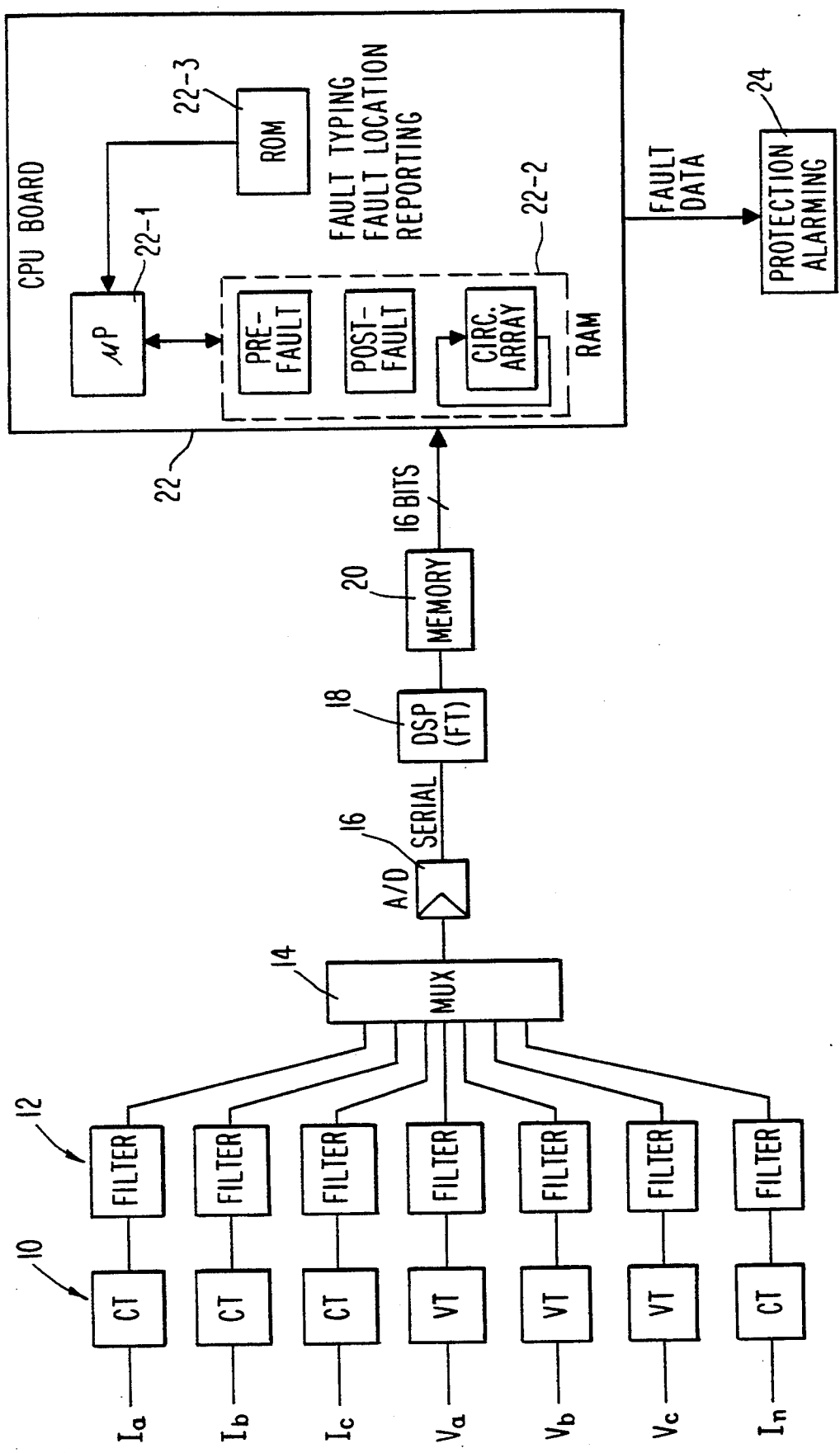
FIG. 5 is a block diagram of one preferred embodiment of a fault location system in accordance with the present invention.

*for Phase-Ground Faults, $I_{rly} = I_{rly} + k((ZL_{zero} - ZL_{pos})/ZL_{pos})I_{zero}$ Block Diagram and Flowchart Description FIG. 5 depicts one presently preferred embodiment of a fault location system in accordance with the present invention. As shown, the system comprises current and voltage transducers 10, filters 12, and a multiplexor 14, the latter outputting an interleaved stream of analog phase current and voltage signal samples, as well as neutral current samples. The analog multiplex output by the multiplexor 14 is digitized by an analog-to-digital converter 16. The output of the analog-to-digital converter 16 is fed to a digital signal processing block 18. The digital signal processing block 18 employs a Fourier transformation to produce phasor data for each of the sampled channels. The phasor data is stored in a memory 20. The phasor data in the memory 20 is fed via a 16-bit data bus to a central processing unit (CPU) board 22. The CPU board 22 includes a microprocessor 22-1, random access memory 22-2, and read only memory (ROM) 22-3. The (ROM) 22-3 contains program code controlling the microprocessor 22-1 in performing fault typing, fault location, and reporting functions. The random access memory 22-2 includes a pre-fault segment of memory, a post-fault segment of memory, and a circular array, which are employed as described below in performing the fault typing and fault location functions. The CPU board 22 outputs fault data to a protection/alarming block 24 that performs protection and alarming functions such as tripping a circuit breaker or sounding an alarm as appropriate.

Figure 6:
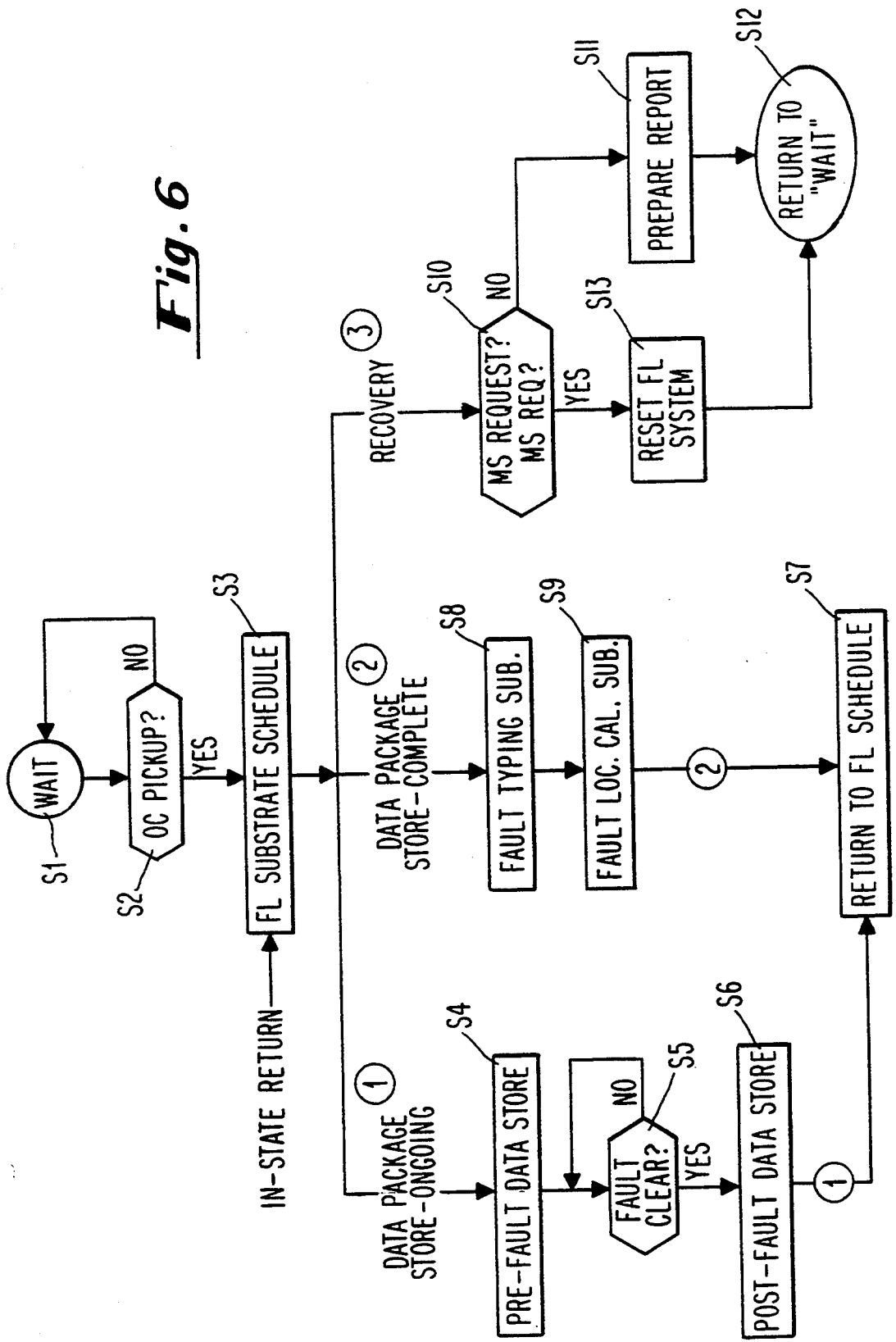
FIG. 6 is a flowchart of the operation of a fault location system in accordance with the present invention.

FIG. 6 is a flow chart of a presently preferred sequence of operation of the fault location/typing system of the present invention. The system waits at step S1 until an overcurrent condition, or a specific disturbance signal, has been detected at step S2. When an overcurrent condition is detected, the system initiates a fault location substate schedule at step S3. The operation proceeds initially in accordance with the left hand branch of the fault location substate schedule. That is, pre-fault data is stored at step S4 (e.g., three cycles of pre-fault data is moved from the circular array (22-2 of FIG. 5) to the pre-fault memory); the system waits until the fault is clear at step S5; and then the system stores post-fault data at step S6 (e.g., three cycles of post-fault data is moved from the circular array to the post-fault memory). At step S7 the operation returns to the fault location substate schedule step S3. The operation then continues as indicated by the center branch of the fault location substate schedule. At step S8, a fault typing subroutine is executed. At step S9, a fault location subroutine is executed. The operation then returns to the fault location substate schedule. The recovery branch of the fault location substate schedule is indicated in the right hand branch of the flowchart. Step S10 examines a master schedule to determine requests for functions such as overcurrent protection, metering, or resetting a circuit breaker. If there is such a combination of conditions that warrants an abort request, the fault location system is reset at step S13 and the abort request is fulfilled. If there is no master schedule request pending, a report is prepared at step S11. For example, the report may include the fault location (in miles or kilometers), the fault resistance estimation, and the fault type. In addition, the report may include a source and a load impedance estimation. At step S12, the operation returns to the wait step S1.

The above description of preferred embodiments is not intended to impliedly limit the scope of protection of the following claims. Thus, for example, except where they are expressly so limited, the following claims are not limited to applications involving three-phase power systems or power systems employing a 60 Hz or 50 Hz fundamental frequency. Moreover, the claims are not limited to fault location systems associated with any particular part (i.e., transformer, feeder, high power transmission line, etc.) of a power distribution system. Further, some inventive aspects of the above disclosure are applicable to areas other than fault location. For example, the above-described technique for correcting time-skewed data output by a multiplexor could be employed in a metering device or another type of device that samples a plurality of channels with a multiplexor.

I claim:

1. A fault location system for locating faults associated with one or more conductors of an electric power transmission or distribution system, said system having an associated protective relay at a known location along said conductors, comprising:

(a) a multiplexor for obtaining multiple samples of a plurality of phase currents and voltages, on said conductors, said multiplexor introducing a time-skew into at least some of said samples;

(b) an analog-to-digital convertor for converting said samples to digital sample data;

(c) means for deriving time-skew corrected sample data from said digital sample data;

(d) means for deriving phasor data for said currents and voltages on the basis of the time-skew corrected data;
(e) means for detecting when a fault occurs;
(f) means for processing said phasor data to compose a pre-fault fundamental phasor and a post-fault fundamental phasor, wherein the pre-fault and post-fault phasors are phase coherent; and
(g) means for iteratively determining a fault location parameter (M) and a fault resistance parameter (RF) on the basis of the phase coherent pre-fault and post-fault fundamental phasors.

2. A fault location system as recited in claim 1, wherein said means for deriving time-skew corrected sample data from said digital sample data comprises means for estimating the value of a desired sample ($V_{i+1}(t)$) from the equation:

$V_{i+1}(t) = (sk/dts)V_i(t+sk) + (V_{i+1}(t+sk))(dts-sk)/dts$, where "sk" represents the time skew between the desired sample $V_{i+1}(t)$ and a time-skewed sample $V_{i+1}(t+sk)$, and "dts" represents a known sampling interval between said time skewed sample $V_{+1}(t+sk)$ and a previous time-skewed sample $V_i(t+sk)$.

3. A fault location system as recited in claim 2, wherein said multiplexor introduces a phase-skew between signal channels, wherein each phase current and phase voltage corresponds to a different channel, and said fault location system further comprises phase-skew correction means for correcting for the phase-skew between respective phasors obtained from different channels.

4. A fault location system as recited in claim 3, wherein said phase-skew correction means multiplies the phasors to be corrected by a phasor of the form, $e^{j\phi sk}$, where $\phi sk$ represents the phase-skew.

5. A fault location system as recited in claim 1, wherein said means for deriving phasor data comprises means for performing a Fourier transformation of said time-skew corrected data.

6. A fault location system as recited in claim 1, wherein said means for deriving phasor data comprises means for deriving a real part of a given phasor by performing a convolution of corresponding time-domain samples with a unit cosine function and deriving an imaginary part of said given phasor by performing a convolution of said time-domain samples with a unit sine function, wherein said given phasor is composed of said real and imaginary parts.

7. A fault location system as recited in claim 1, wherein the power distribution system comprises multiple phases (phase-a, phase-b, phase-c) and the fault location system further comprises fault typing means for determining, on the basis of said phasor data, whether the fault is a phase-to-phase, three-phase, phase-to-ground, phase-to-phase-to-ground, or three-phase-to-ground fault.

8. A fault location system as recited in claim 7, wherein said phase current and voltage samples are obtained at a protective relay location and the fault location system further comprises loop compensation means for adjusting a relay current sample $I_{rly}$ to compensate for current loops.

9. A fault location system as recited in claim 8, wherein, for ground fault cases, said loop compensation means derives an adjusted relay current sample ($I_{rly}'$) from a relay current sample ($I_{rly}$) in accordance with the formula, $I_{rly}' = I_{rly} + \kappa I_0 (ZL_{zero} - ZL_{pos})/Z_{pos}$, where $I_0 = (I_a + I_b + I_c)/3$, $I_a, I_b$, and $I_c$ respectively represent phase-a, phase-b, and phase-c current phasors; $\kappa$ is a scaling parameter in the range 0.7–1.5; and $ZL_{pos}$ and $ZL_{zero}$ respectively represent a positive sequence impedance and a zero sequence impedance.

10. A fault location system as recited in claim 8, wherein, for phase-to-phase and phase-to-phase-to-ground faults an adjusted relay voltage ($V_{rly}'$) and an adjusted relay current ($I_{rly}'$) are derived from phase voltage samples ($V_x, V_y$) and phase current samples ($I_x, I_y$) as $V_{rly}' = V_x - V_y$, and $I_{rly}' = I_x - I_y$ where the subscripts x, y represent the particular phases involved in the fault.

11. A fault location system as recited in claim 8, wherein, for three-phase and three-phase-to-ground faults, an adjusted relay voltage sample ($V_{rly}'$) and an adjusted relay current sample ($I_{rly}'$) are derived from a phase voltage sample ($V_a, V_b, V_c$) and a phase current sample ($I_a, I_b, I_c$) as $V_{rly}' = V_a$ or $V_b$ or $V_c$ $I_{rly}' = I_a$ or $I_b$ or $I_c$.

12. A fault location system as recited in claim 8, wherein, a relay voltage sample ($V_{rly}$) and a relay current sample ($I_{rly}$) are composed from a phase voltage phasor ($V_a, V_b, V_c$) and a phase current phasor ($I_a, I_b, I_c$) in accordance with the following table, wherein $ZL_{pos}$ and $ZL_{zero}$ respectively represent a positive sequence impedance and a zero sequence impedance:

| Fault Type | $I_{rly}$ | $V_{rly}$ |
|---|---|---|
| a-G | $I_a$* | $V_a$ |
| b-G | $I_b$* | $V_b$ |
| c-G | $I_c$* | $V_c$ |
| b-c-G | $I_b$-$I_c$ | $V_b$-$V_c$ |
| c-a-G | $I_c$-$I_a$ | $V_c$-$V_a$ |
| a-b-G | $I_a$-$I_b$ | $V_a$-$V_b$ |
| b-c | $I_b$-$I_c$ | $V_b$-$V_c$ |
| c-a | $I_c$-$I_a$ | $V_c$-$V_a$ |
| a-b-c | $I_a$ | $V_a$ |

*for Phase-Ground Faults, $I_{rly} = I_{rly} + k((ZL_{zero} - ZL_{pos})/ZL_{pos})I_{zero}$ 13. A fault location system as recited in claim 1, further comprising means for estimating source voltage and source impedance without prior knowledge of their respective values.

14. A fault location system as recited in claim 1, further comprising means for dynamically estimating a load impedance and fault resistance.

15. Apparatus for sampling data and deriving time-skew corrected sample data, comprising:
a multiplexor for obtaining digital sample data, said digital sample data including a sample-to-sample time skew introduced by said multiplexor; and means for estimating the value of a desired sample ($V_{i+1}(t)$) from the equation:

$$V_{i+}(t) = (sk/dts)V_i(t+sk) + (V_{i+1}(t+sk))(dts-sk)/dts,$$

where "sk" represents the time skew between the desired sample $V_{i+1}(t)$ and a time-skewed sample $V_{i+1}(t+sk)$, and "dts" represents a known sampling interval between said time skewed sample $V_{+1}(t+sk)$ and a previous time-skewed sample $V_i(t+sk)$.

16. Apparatus as recited in claim 15, wherein said multiplexor samples a plurality of signal channels and introduces a phase skew between channels and the apparatus further comprises phase-skew correction means for correcting for the phase-skew between respective phasors obtained from different channels.

17. Apparatus as recited in claim 16, wherein said phase skew correction means multiplies the phasors to be corrected by a phasor of the form, $e^{j\phi sk}$ where $\phi sk$ represents the phase-skew.

18. A fault location system for locating faults associated with one or more conductors of an electric power transmission or distribution system, said system having an associated protective relay at a known location along said conductors, comprising:
(a) a signal sampling system for obtaining multiple samples of a plurality of phase currents and voltages on said conductors, signal sampling system comprising at least one member of the group consisting of a current transformer, a voltage transformer, and a multiplexor;
(b) an analog-to-digital convertor for converting said samples to digital sample data;
(c) means for deriving phasor data for said currents and voltages on the basis of the sample data;
(d) means for detecting when a fault occurs;
(e) means for processing said phasor data to compose a pre-fault fundamental phasor and a post-fault fundamental phasor, wherein the pre-fault and post-fault phasors are phase coherent; and
(f) means for iteratively determining a fault location parameter (M) and a fault resistance parameter (RF) on the basis of the phase coherent pre-fault and post-fault fundamental phasors.

19. A fault location system as recited in claim 18, further comprising means for determining correction factors for fault resistance (RFFAC), load impedance (ZDFAC), and line impedance (ZLFAC), and for determining an iterative distance estimate (M11) as a function of said correction factors;
wherein said load impedance correction factor ZDFAC is estimated as ZDFAC $=(583/Mag(ZD))^{0.8}$ wherein ZD represents an estimate of a load impedance;
wherein said line impedance correction factor ZLFAC is estimated as ZLFAC$=$Mag(ZL)/9.124, wherein ZL represents an estimate of a line impedance; and
wherein said fault resistance correction factor RFFAC is estimated as RFFAC$=$RFTRIM1 $(50/Mag(RF1))^{0.8}$, wherein RF1 is an estimate of a fault resistance and RFTRIM1 is a number whose value is set as a function of the magnitude of RF1.

20. A fault location system as recited in claim 19, wherein RFTRIM1 is set in accordance with the following formula:

RFMUL$=$Mag(RF1);
RFTRIM1$=$7.6 if RFMUL is greater than 51;
RFTRIM1$=$8.4 if RFMUL is less than 51.1;
RFTRIM1$=$6.8 if RFMUL is greater than 91.

21. A fault location system as recited in claim 19, wherein RF1 is obtained from the equation, $$RF1 = (((1-M1)ZL+ZD1)(ZF_{ap1}-M1\ ZL))/(-ZF_{ap1}+ZL+ZD1),$$

wherein M1 is a first iterative distance estimate, $ZF_{ap1}$ is an apparent fault impedance estimate, and ZD1 is a first iterative load impedance estimate.

22. A fault location system as recited in claim 19, wherein M11 is given by:

$$M11 = M1 - (0.06\ Re((ZF_{ap1}/ZLFAC)(ZDFAC/RFFAC))),$$

wherein $ZF_{ap1}$ is an apparent fault impedance estimate.

* * * * *

UNITED STATES PATENT AND TRADEMARK OFFICE
CERTIFICATE OF CORRECTION

PATENT NO. : 5,428,549
DATED : June 27, 1995
INVENTOR(S) : Muchuan M. Chen

It is certified that error appears in the above-indentified patent and that said Letters Patent is hereby corrected as shown below:

At column 5, line 29: $(I_{rly})$ should be $(I_{rly}')$

At column 6, line 30: $V_{rly}$, $I_{rly}$ should be $V_{\underline{rly}}$, $I_{\underline{rly}}$ At column 17, line 30: before "signal sampling system" insert the word --said--.

Signed and Sealed this

Twenty-fourth Day of October, 1995

Attest:

BRUCE LEHMAN

Attesting Officer

Commissioner of Patents and Trademarks